(12) United States Patent
Huang et al.

(10) Patent No.: US 6,555,425 B2
(45) Date of Patent: Apr. 29, 2003

(54) METHOD FOR MANUFACTURING TRANSISTOR

(75) Inventors: Kuo-Tai Huang, Hsinchu (TW); Ellen Cheng, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/880,519

(22) Filed: Jun. 12, 2001

(65) Prior Publication Data

US 2002/0182799 A1 Dec. 5, 2002

(30) Foreign Application Priority Data

Jun. 5, 2001 (TW) ........................................ 90113552 A

(51) Int. Cl.[7] .......................................... H01L 21/8238
(52) U.S. Cl. ...................................... 438/222; 438/256
(58) Field of Search ................................ 438/199, 201, 438/222, 229, 230, 236, 226, 256, 366

(56) References Cited

U.S. PATENT DOCUMENTS

| | | | |
|---|---|---|---|
| 6,057,185 A | * | 5/2000 | Suenaga |
| 6,194,258 B1 | * | 2/2001 | Wuu |
| 6,255,152 B1 | * | 7/2001 | Chen |
| 6,297,107 B1 | * | 10/2001 | Paton et al. |
| 6,319,784 B1 | * | 11/2001 | Yue et al. |
| 6,359,291 B1 | * | 3/2002 | Liu et al. |

\* cited by examiner

Primary Examiner—David Nelms
Assistant Examiner—Phuc T. Dang
(74) Attorney, Agent, or Firm—Charles C. H. Wu; Wu & Cheung, LLP

(57) ABSTRACT

A method of manufacturing a transistor. The method comprising the steps of providing a substrate. The substrate comprises a gate oxide layer formed thereon, a polysilicon layer formed on the gate oxide layer, an offset spacer formed on a sidewall of the polysilicon layer and the gate oxide layer and a source/drain formed in the substrate. A conformal dielectric layer is formed over the polysilicon layer, the offset spacer and the source/drain. A spacer is formed on the sidewall of a portion of the conformal dielectric layer over the offset spacer. A portion of the conformal dielectric layer is removed to expose the polysilicon layer and the source/drain. A selective epitaxial growth process is performed to form an epitaxial layer on the polysilicon layer and the source/drain. A portion of the epitaxial layer on the polysilicon layer, the polysilicon layer and the gate oxide layer together form a T-type gate structure.

26 Claims, 2 Drawing Sheets

METHOD FOR MANUFACTURING TRANSISTOR

CROSS-REFERENCE TO RELATED APPLICATION

This application claims the priority benefit of Taiwan application serial no. 90113552, filed on Jun. 5, 2001.

BACKGROUND OF THE INVENTION

1. Field of Invention

The present invention relates to a method for manufacturing a transistor. More particularly, the present invention relates to a method for manufacturing an MOS transistor with a T-type gate structure.

2. Description of Related Art

With the decrease of size of ICs and the increase of integration of ICs, the wire width, the contact area and junction depth of a device becomes small. In order to efficiently improve the potential of the device and decrease the resistance and RC time delay, a silicide is formed on the surface of the device (such as the surface of the gate and the source/drain) to efficiently decrease the contact resistance.

Typically, the method for manufacturing a silicide on a junction of a device comprises steps of sputtering a metal layer over the transistor after the gate, the spacer of the gate and the source/drain of the transistor are formed. Thereafter, a rapid thermal process is performed to form a silicide on the surface of the gate and the source/drain.

However, the typical method for forming the silicide to decrease the contact resistance consumes many silicon atoms, especially during the formation of a silicon copper film. It is well known that every 100-angstrom-thickness copper should react with a 360-angstrom-thickness silicon to form a silicon copper layer. Therefore, this kind of consumption of silicon leads to the increase of the resistance of the source/drain and the decrease of the operating speed of the device. Moreover, the size of the silicide on the gate is limited by the width of the gate, so that the contribution of the silicide on the gate to the decrease of the resistance of the gate is limited. Additionally, with the decrease of the size of the device, it is easy to induce the bridging effect between the gate and the source/drain by using the typical silicide method. Furthermore, the spacer formed by the conventional method cannot sufficiently avoid the diffusion of the hydrogen ions into the channel during the manufacturing process. Hence, it is easy to induce the boron penetration phenomena so that the threshold voltage of the device will become unstable.

SUMMARY OF THE INVENTION

The invention provides a method of manufacturing a transistor. The method comprising the steps of providing a substrate. The substrate comprises a gate oxide layer formed thereon, a polysilicon layer formed on the gate oxide layer, an offset spacer formed on a sidewall of the polysilicon layer and the gate oxide layer and a source/drain formed in the substrate. A conformal dielectric layer is formed over the polysilicon layer, the offset spacer and the source/drain. A spacer is formed on the sidewall of a portion of the conformal dielectric layer over the offset spacer. A portion of the conformal dielectric layer is removed to expose the polysilicon layer and the source/drain. A selective epitaxial growth process is performed to form an epitaxial layer on the polysilicon layer and the source/drain. A portion of the epitaxial layer on the polysilicon layer, the polysilicon layer and the gate oxide layer together form a T-type gate structure.

In the present invention, since the epitaxial layer formed on the polysilicon layer is relatively large, the resistance of the T-type is decreased and the operating rate of the device can be greatly improved. Moreover, by using the selective epitaxial growth process, the epitaxial layers are respectively formed on the polysilicon layer and the source/drain to decrease the contact resistance. Hence, the problem of the high resistance of the gate and the source/drain caused by over consumption of the silicon atoms in the substrate during the formation of the silicide in the conventional process can be overcome. Furthermore, because the formation of the epitaxial layer does not consume the silicon atoms in the substrate, the problem of the junction leakage induced by shrinking the size of the device can be overcome. Because the spacer is relatively thick and uniform, the diffusion of the hydrogen ions into the channel and the penetration of the boron ions cab be avoided. Therefore, the stability of the threshold voltage of the device can be greatly improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1E are schematic, cross-sectional views of the process for manufacturing a transistor in a preferred embodiment according to the invention.

Figure 1A:
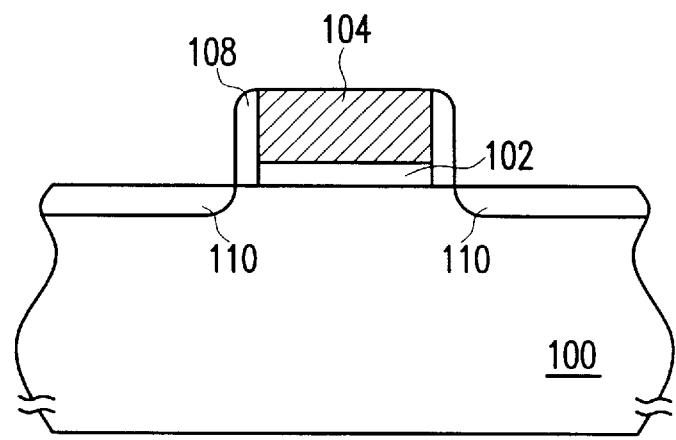
FIGS. 1A through 1E are schematic, cross-sectional views of the process for manufacturing a transistor in a preferred embodiment according to the invention.

As shown in FIG. 1A, a substrate 100 having a gate oxide layer 102 and a polysilicon layer 104 formed thereon is provided. An offset spacer 108 is formed on a sidewall constructed by the polysilicon layer 104 and the gate oxide layer 102. For example, the method for forming the offset spacer 108 comprises the steps of forming a conformal oxide layer (not shown) over the substrate and etching back the conformal oxide layer. The offset spacer 108 can be an oxide spacer with a thickness about 150–250 angstroms, for example. By using the polysilicon layer 104 and the offset spacer 108 as masks, an ion implantation process is performed to form a lightly doped drain region 110 in a portion of the substrate 100 near to a portion of the substrate 100 beneath the gate oxide layer 102 and the offset spacer 108.

Figure 1B:
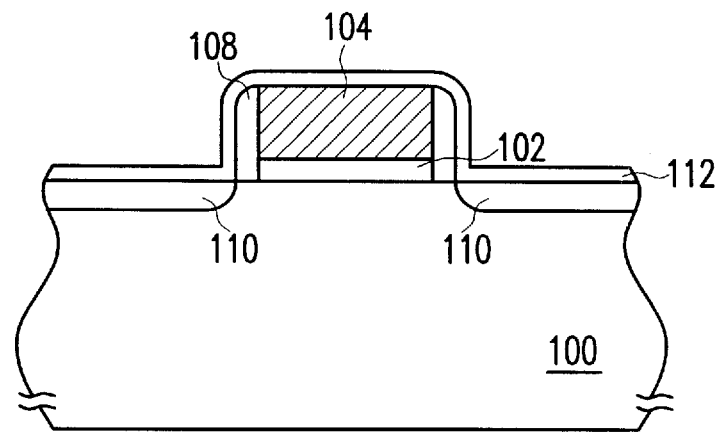

As shown in FIG. 1B, a conformal dielectric layer 112 is formed over the substrate 100 to cover the polysilicon layer 104, the offset spacer 108 and the lightly doped drain region 110. The conformal dielectric layer 112 can be formed from silicon oxide by chemical vapor deposition (CVD), for example. The thickness of the conformal dielectric layer 112 is about 50–150 angstroms, for example.

Figure 1C:
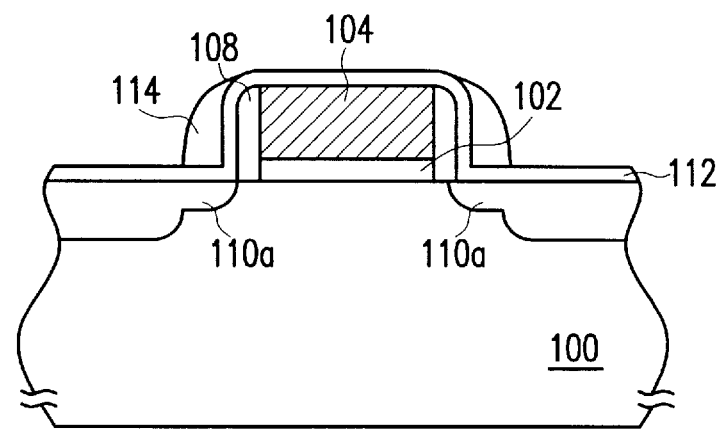

As shown in FIG. 1C, a spacer 114 is formed on the sidewall of the conformal dielectric layer 112 covering the offset spacer 108. The method of forming the spacer 114 comprises the steps of forming a conformal silicon nitride layer (not shown) over the conformal dielectric layer 112 and then etching back the conformal silicon nitride layer, for example. Preferably, the conformal silicon nitride layer is formed by rapid thermal-chemical vapor deposition (RT-CVD) or atomic layer-chemical vapor deposition (AL-CVD).

In the present embodiment, the spacer 114 formed by RT-CVD or AL-CVD is thicker and more uniform than the spacer formed by the conventional deposition process, so that the bridging effect happens between the gate and the source/drain can be well avoided. Moreover, the diffusion of the hydrogen ions into the channel and the penetration of the boron ions can be avoided and the device will no longer suffer from the problem of unstable threshold voltage.

By using the polysilicon layer 104, the offset spacer 108, the conformal dielectric layer 112 and the spacer 114 as masks, an ion implantation process is performed to form a source/drain region 110a in the substrate 100.

Figure 1D:
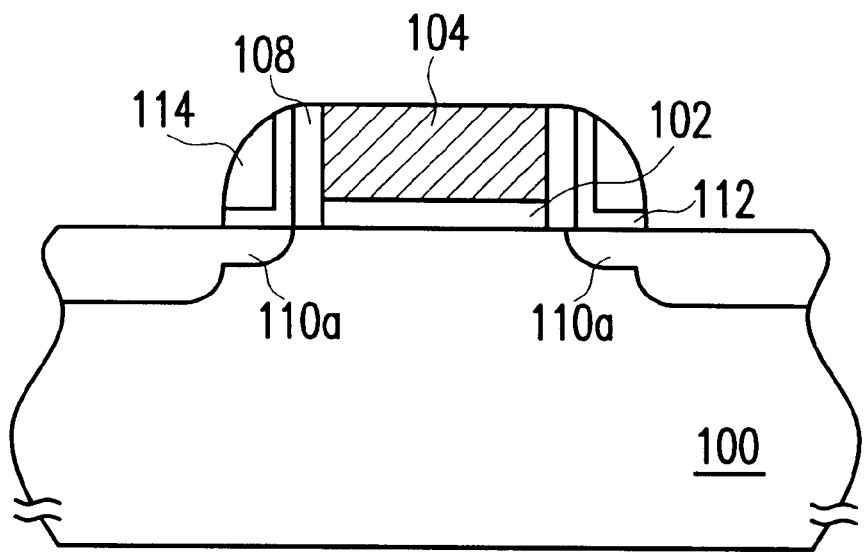

As shown in FIG. 1D, a portion of the conformal dielectric layer 112 without being covered by the spacer 114 is removed to expose the polysilicon layer 104 and the source/drain region 110a. The method for removing the portion of the conformal dielectric layer 112 can be wet etching by using hydrofluoric acid, for example. Hydrogen gas is introduced to cover the substrate 100 to prevent the surface of the polysilicon layer 104 and the source/drain region 110a from generating native oxide. The temperature during introducing hydrogen gas is about 750–900 centigrade, for example.

Figure 1E:
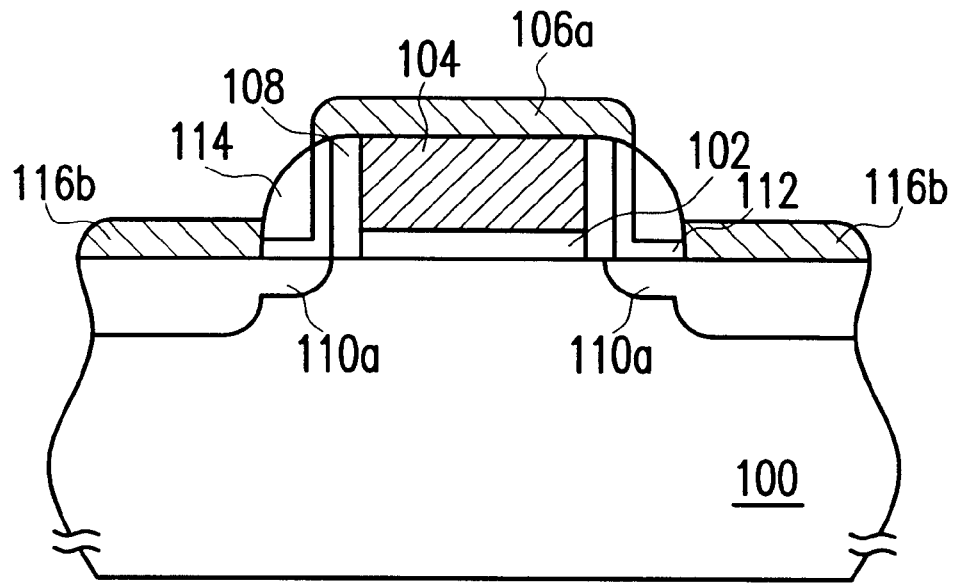

As shown in FIG. 1E, a selective epitaxial growth process is performed to form an epitaxial layer 116a on the polysilicon layer 104 and an epitaxial layer 116b on the source/drain region 116b. The selective epitaxial growth process comprises the step of introducing $Si_2Cl_2H_2$ with a flow about 0.03–0.5 L/min, $H_2$ with a flow about 15–25 L/min and HCl with a flow 0.02–0.1 L/min under a temperature about 700–850 centigrade and a pressure about 5–30 torr, for example.

Since the width of the epitaxial layer 116a on the polysilicon layer 104 is equal to the width composed by the polysilicon layer 104, the offset spacer 108 and conformal dielectric layer 112, the epitaxial layer 116a, the polysilicon layer 104 and the gate oxide layer 102 together form a T-type gate structure.

In the present invention, by using the selective epitaxial growth process, the epitaxial layers 116a and 116b are respectively formed on the polysilicon layer 104 and the source/drain 110a to decrease the contact resistance, so that the problem of the high resistance of the gate and the source/drain caused by over consumption of the silicon atoms in the substrate 100 during the formation of the silicide in the conventional process can be overcome. Moreover, since the epitaxial layer formed on the polysilicon layer 104 is relatively large, the resistance of the T-type is decreased and the operating rate of the device can be greatly improved. Further, because the formation of the epitaxial layer does not consume the silicon atoms in the substrate, and the spacer 114 is relatively thick and uniform, the problem of the junction leakage induced by shrinking the size of the device can be overcome.

Altogether, the invention possesses the following advantages:

1. In the present invention, since the epitaxial layer formed on the polysilicon layer is relatively large, the resistance of the T-type is decreased and the operating rate of the device can be greatly improved.

2. In the present invention, by using the selective epitaxial growth process, the epitaxial layers are respectively formed on the polysilicon layer and the source/drain to decrease the contact resistance. Hence, the problem of the high resistance of the gate and the source/drain caused by over consumption of the silicon atoms in the substrate 100 during the formation of the silicide in the conventional process can be overcome.

3. In the present invention, because the formation of the epitaxial layer does not consume the silicon atoms in the substrate, the problem of the junction leakage induced by shrinking the size of the device can be overcome.

4. In the present invention, because the spacer is relatively thick and uniform, the diffusion of the hydrogen ions into the channel and the penetration of the boron ions cab be avoided. Therefore, the stability of the threshold voltage of the device can be greatly improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a transistor, comprising the steps of:

providing a substrate, wherein the substrate comprises a gate oxide layer formed thereon, a polysilicon layer formed on the gate oxide layer, an offset spacer formed on a sidewall of the polysilicon layer and the gate oxide layer and a source/drain formed in the substrate;

forming a conformal dielectric layer over the polysilicon layer, the offset spacer and the source/drain;

forming a spacer on the sidewall of a portion of the conformal dielectric layer over the offset spacer;

removing a portion of the conformal dielectric layer to expose the polysilicon layer and the source/drain; and performing a selective epitaxial growth process to form an epitaxial layer on the polysilicon layer and the source/drain, wherein a portion of the epitaxial layer on the polysilicon layer, the polysilicon layer and the gate oxide layer together form a T-type gate structure.

2. The method of claim 1, wherein the selective epitaxial growth process comprises the step of introducing $Si_2Cl_2H_2$ with a flow about 0.03–0.5L/min, $H_2$ with a flow about 15–25L/min and HCl with a flow 0.02–0.1L/min.

3. The method of claim 2, wherein the selective epitaxial growth process is performed under a temperature about 700–850 centigrade.

4. The method of claim 2, wherein the selective epitaxial growth process is performed under a pressure about 5–30 torr.

5. The method of claim 1, wherein the step of removing the portion of the conformal dielectric layer includes a wet etching with hydrofluoric acid.

6. The method of claim 1, wherein hydrogen gas is introduced to cover the substrate to prevent the polysilicon layer and the source/drain from generating native oxide after the step of removing the portion of the conformal dielectric layer.

7. The method of claim 1, wherein the step of forming the spacer further comprises the steps of:

forming a conformal material layer over the conformal dielectric layer; and etching back the conformal material layer to form the spacer.

8. The method of claim 7, wherein the step of forming the conformal material layer includes rapid-thermal-chemical vapor deposition or atomic layer-chemical vapor deposition.

9. The method of claim 8, wherein the material layer is made of silicon nitride.

10. The method of claim 1, wherein the conformal dielectric layer is made of silicon oxide.

11. The method of claim 10, wherein the thickness of the conformal dielectric layer is about 50–150 angstroms.

12. The method of claim 1, wherein the offset spacer is made of silicon oxide.

13. The method of claim 12, wherein the thickness of the offset spacer is about 150–250 angstroms.

14. A method of manufacturing a transistor with a T-type gate structure, comprising the steps of:

providing a patterned polysilicon layer;

forming an offset spacer on a sidewall of the polysilicon layer;

forming a conformal dielectric layer over the polysilicon layer and the offset spacer;

forming a spacer on the sidewall of the conformal dielectric layer formed on the offset spacer;

removing a portion of the conformal dielectric layer to expose the polysilicon layer; and performing a selective epitaxial growth process to form an epitaxial layer on the polysilicon layer, wherein the epitaxial layer and the polysilicon layer together form a T-type gate structure.

15. The method of claim 14, wherein the selective epitaxial growth process comprises the step of introducing $Si_2Cl_2H_2$ with a flow about 0.03–0.5L/min, $H_2$ with a flow about 15–25L/min and HCl with a flow 0.02–0.1L/min.

16. The method of claim 15, wherein the selective epitaxial growth process is performed under a temperature about 700–850 centigrade.

17. The method of claim 15, wherein the selective epitaxial growth process is performed under a pressure about 5–30 torr.

18. The method of claim 14, wherein the step of removing the portion of the conformal dielectric layer includes a wet etching with hydrofluoric acid.

19. The method of claim 14, wherein hydrogen gas is introduced to cover the polysilicon layer to prevent the polysilicon layer from generating native oxide after the step of removing the portion of the conformal dielectric layer.

20. The method of claim 14, wherein the step of forming the spacer further comprises the steps of:

forming a conformal material layer over the conformal dielectric layer; and etching back the conformal material layer to form the spacer.

21. The method of claim 20, wherein the step of forming the conformal material layer includes rapid-thermal-chemical vapor deposition or atomic layer-chemical vapor deposition.

22. The method of claim 20, wherein the material layer is made of silicon nitride.

23. The method of claim 20, wherein the conformal dielectric layer is made of silicon oxide.

24. The method of claim 23, wherein the thickness of the conformal dielectric layer is about 50–150 angstroms.

25. The method of claim 24, wherein the offset spacer is made of silicon oxide.

26. The method of claim 25, wherein the thickness of the offset spacer is about 150–250 angstroms.

* * * * *